United States Patent
Woo et al.

(12) 
(10) Patent No.: US 6,433,402 B1
(45) Date of Patent: Aug. 13, 2002

(54) SELECTIVE COPPER ALLOY DEPOSITION

(75) Inventors: Christy Mei-Chu Woo, Cupertino; Pin-Chin Connie Wang, Menlo Park; Amit Marathe, Milpitas; Diana M. Schonauer, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/713,314

(22) Filed: Nov. 16, 2000

(51) Int. Cl.[7] .............................................. H01L 29/00
(52) U.S. Cl. ....................... 257/525; 257/501; 257/508; 257/520; 257/521; 257/659; 257/762
(58) Field of Search ................................ 257/525, 520, 257/521, 501, 508, 659, 767, 762

(56) References Cited

U.S. PATENT DOCUMENTS 5,354,712 A * 10/1994 Ho et al. ..................... 437/195
5,731,245 A * 3/1998 Joshi et al. .................. 438/705
5,972,192 A * 10/1999 Dubin et al. ................. 205/101
6,022,808 A * 2/2000 Nogami et al. .............. 438/694
6,184,137 B1 * 2/2001 Ding et al. .................. 438/687
6,258,710 B1 * 7/2001 Rathore et al. .............. 438/628

FOREIGN PATENT DOCUMENTS

JP       11102909 A   *  4/1999

* cited by examiner

Primary Examiner—Nathan Flynn
Assistant Examiner—Remmon R. Fordé

(57) ABSTRACT

Copper or a low resistivity copper alloy is initially deposited to fill relatively narrow openings leaving relatively wider openings unfilled. A copper alloy having improved electromigration resistance with respect to copper is then selectively deposited to fill the relatively wider openings, thereby improving electromigration resistance without increasing narrow line resistance. Embodiments include annealing after filling the relatively narrow openings and before filling the relatively wider openings, thereby reducing void formation in narrow lines.

6 Claims, 3 Drawing Sheets

SELECTIVE COPPER ALLOY DEPOSITION

RELATED APPLICATIONS

This application contains subject matter similar to subject matter disclosed in copending U.S. patent application Ser. No. 09/713,313 filed on Nov. 16, 2000, copending U.S. patent application Ser. No. 09/593,231 filed on Jun. 14, 2000, and copending U.S. patent application Ser. No. 09/655,699 filed on Sep. 6, 2000.

FIELD OF THE INVENTION

The present invention relates to a semiconductor device comprising a high conductivity interconnect structure, and to a method of forming the high conductivity interconnect structure. The present invention is applicable to high speed integrated circuits, particularly integrated circuits having sub-micron design features.

BACKGROUND ART

As integrated circuit geometry continues to plunge into the deep sub-micron regime, it becomes increasingly difficult to satisfy the requirements of high performance microprocessor applications for rapid circuitry speed. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction of design rules into the deep sub-micron regime requires decreasing the R and C associated with interconnection paths. Thus, low resistivity interconnection paths are critical to fabricating dense, high performance devices.

One way to increase the control speed of semiconductor circuitry is to reduce the resistance of a conductive pattern. Copper (Cu) is considered a viable alternative to aluminum (Al) for metallization patterns, particularly for interconnect systems having smaller dimensions. Cu has a lower bulk resistivity and potentially higher electromigration tolerance than Al. Both the lower bulk resistivity and higher electromigration tolerance improve circuit performance. A conventional approach to forming a Cu interconnection involves the use of damascene processing in which openings are formed in an interlayer dielectric (ILD) and then filled with Cu. Such damascene techniques typically include single as well as dual damascene techniques, the latter comprising forming a via opening in communication with a trench opening and simultaneously filling by metal deposition to form a via in communication with a metal line.

However, Cu is a mid-gap impurity in silicon and silicon dioxide. Accordingly, Cu diffusion through interlayer dielectrics, such as silicon dioxide, degrades the performance of the integrated circuit. A conventional approach to the diffusion problem comprises depositing a barrier material to encapsulate the Cu line. Typically diffusion barrier materials include tantalum (Ta), tantalum nitride (TaN), titanium nitride (TiN), titanium tungsten (TiW), and silicon nitride for encapsulating Cu. The use of such barrier materials to encapsulate Cu is not limited to the interface between the Cu and the ILD, but includes interfaces with other metals as well. In depositing Cu by electroless deposition or electroplating, a seedlayer is also typically deposited to catalyze electroless deposition or to carry electric current for electroplating. For electroplating, the seedlayer must be continuous. However, for electroless plating, very thin catalytic layers can be employed in the form of islands.

Conventional Cu interconnect methodology typically comprises planarizing after Cu deposition, as by chemical-mechanical polishing (CMP), such that the upper surfaces of the filled trenches are substantially coplanar with the upper surface of the ILD. Subsequently a capping layer, such as silicon nitride, is deposited to complete encapsulation of the Cu inlaid metallization. However, adhesion of such a capping layer as to the Cu inlaid metallization has been problematic, and Cu diffusion along the surface of the interface with the capping layer has been found to be a major cause of electromigration failure.

Conventional semiconductor manufacturing processes typically comprise forming a metal level having metal lines with varying widths. A metal level, therefore, typically comprises a collection of metal lines with line widths ranging from about 1× to about 50× of the smallest feature size. Such a smallest feature size can be a via having a diameter or cross sectional width of about 0.15 $\mu$m to about 10 $\mu$m. In implementing Cu metallization in narrow lines, e.g., lines having a width less than about 0.15 $\mu$m, it was found that voiding typically occurs after thermal annealing.

Accordingly, there exists a need for methodology enabling implementation of Cu metallization with improved electromigration resistance in relatively wide lines and reduced void generation in relatively narrow lines. There exists a particular need for such Cu metallization methodology in fabricating semiconductor devices having metal levels with varying line widths in the deep sub-micron regime.

DISCLOSURE OF THE INVENTION

An advantage of the present invention is a method of manufacturing a semiconductor device containing Cu metallized interconnection patterns, exhibiting improved electromigration resistance in relatively wide lines and having reduced voids in relatively narrow lines.

Another advantage of the present invention is a semiconductor device having Cu metallized interconnection patterns, exhibiting improved electromigration resistance in relatively wide lines and having reduced voids in relatively narrow lines.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a plurality of openings in a dielectric layer, at least one of the openings having a width no greater than a first width and at least one of the openings having a width greater than the first width; depositing a layer of substantially pure copper (Cu) or a first Cu alloy completely filling the at least one opening having a width no greater than the first width and partially filling the at least one opening having a width greater than the first width; and depositing a layer of a second Cu alloy, containing an element in a sufficient amount such that the electromigration resistance of the second Cu alloy is greater than that of substantially pure Cu and greater than that of the first Cu alloy, to completely fill the at least one opening having a width greater than the first width.

Embodiments of the present invention include forming a plurality of small openings having a width up to a designated first width and a plurality of large openings having a width greater than the designated first width, depositing a barrier layer to line the openings, filling the openings, planarizing and depositing a silicon nitride capping layer. Embodiments of the present invention include forming the plurality of openings such that the designated first width is about 5 times the smallest feature size, e.g., an interconnection via having a diameter (or width in cross section) of no greater than about 0.20 micron. Embodiments further include depositing a second Cu alloy that contains an element that imparts electromigration resistance to Cu, such as tin, zinc, strontium, palladium, magnesium, chromium and tantalum. The second Cu alloy can have a resistivity lower than, equal to or greater than the first Cu alloy. Embodiments of the present invention further include performing a first anneal after depositing the substantially pure Cu or first Cu alloy layer and before depositing the second Cu alloy layer, and then performing a second anneal after depositing the second Cu alloy layer, thereby minimizing void formation in narrow lines.

Another aspect of the present invention is a semiconductor device comprising: an interlayer dielectric (ILD); a plurality of trenches in the ILD, the plurality of trenches comprising: a plurality of small openings having a width no greater than a first width; and a plurality of large openings having a width greater than the first width; and metal lines filling the trenches; wherein the metal lines filling the small trenches comprise substantially pure copper (Cu) or a first Cu alloy; and the metal lines filling the large trenches comprise a lower layer of substantially pure Cu or the first Cu alloy and an upper layer of a second Cu alloy on the lower layer, the second Cu alloy containing a sufficient amount of an element such that the electromigration resistance of the second Cu alloy is greater than that of substantially pure Cu and greater than that of the first Cu alloy.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1A through. 7, similar elements are denoted by similar reference numerals.

DESCRIPTION OF THE INVENTION

Figure 1A:
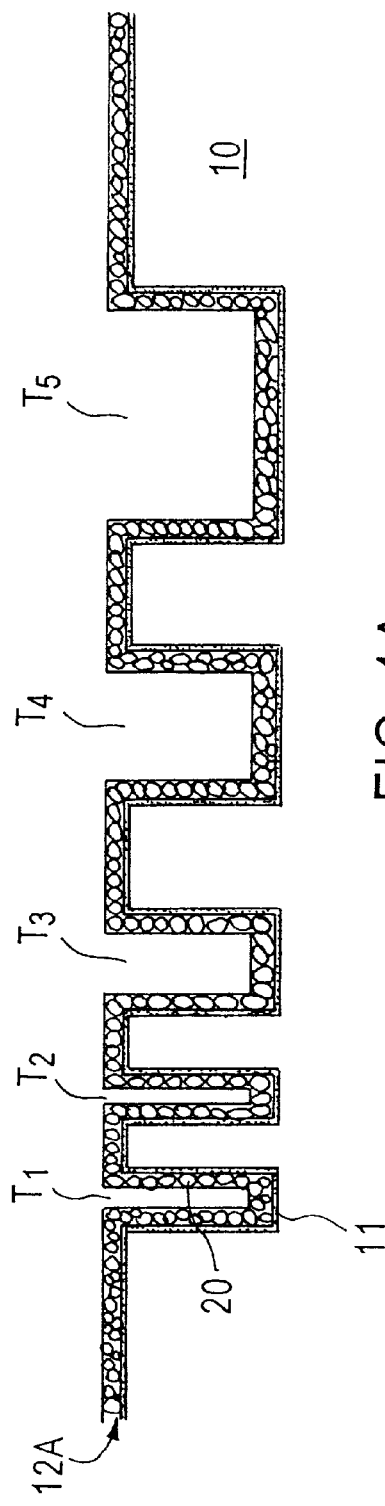
FIGS. 1A through 7 schematically illustrate sequential phases of a method in accordance with an embodiment of the present invention, with FIGS. 1A and 1B illustrating alternative initial phases.

The present invention addresses solves problems attendant upon forming Cu interconnections, particularly when implementing damascene techniques wherein Cu is deposited to fill openings in a dielectric layer that have different widths to form a metal level comprising Cu lines having different widths. Typical metal levels comprise a collection of metal lines with line widths ranging from about 1× to 50× of the smallest feature size, such as a via with a cross sectional width, e.g., a width of about 0.15 micron. Thus, in implementing damascene techniques, a plurality of openings, e.g., trenches, are formed with various size openings. Upon investigating failed or rejected semiconductor devices, it was found that the interface between the Cu metallization and capping layer, e.g., silicon nitride, is a source for electromigration failure due to Cu diffusion along the interface. In addressing this problem, substantially pure Cu was replaced with a Cu alloy containing an element, such as tantalum, indium, tin, zinc, magnesium or zirconium, that improves the electromigration resistance of substantially pure Cu. For example, some alloying elements, such as tantalum, redistribute and segregate along the Cu surface to form an encapsulating layer. Other elements, such as indium and zirconium, form an intermetallic compound with Cu encapsulating the upper surface thereby reducing electromigration.

It was found, however, that such Cu alloys formulated for improved electromigration resistance exhibit higher resistivity than substantially pure Cu as well as some Cu alloys, such as those which inevitable form by virtue of the presence of elements in the plating bath. It was further found that such Cu alloys with improved electromigration resistance cause an undesirably high increase in resistance in relatively narrower lines vis-à-vis relatively wider lines.

Another problem addressed and solved by the present invention is the generation of voids within relatively narrow metal lines upon thermal cycling. After experimentation and investigation, it was found that for a completely filled metal line, void formation within the narrow lines can be reduced by reducing the amount of overburden or bulk Cu or Cu alloy above the filled trench during thermal annealing. Conventional practices involve forming a Cu or Cu alloy metal level of different line widths by depositing a sufficient amount of bulk Cu or Cu alloy to ensure complete filling of the relatively wide trenches. Consequently, the narrower lines have a relatively thicker bulk Cu layer above the plane of complete fill during thermal anneal and, hence, a significantly greater amount of voids are generated in relatively narrow lines after thermal annealing than in relatively wider lines.

The present invention addresses and solves the electromigration problem while simultaneously avoiding an increase in resistivity of the narrow metal lines. Embodiments of the present invention further include reducing void formation in relatively narrower lines when metallizing a level having trenches of varying widths to form metal lines of varying width.

The present invention achieves these and other objectives by initially forming a plurality of openings in a dielectric layer, e.g., trenches in an ILD, the trenches having a plurality of widths to ultimately form metal lines having widths ranges from about 1× to about 50× of the smallest feature size, such as a via, e.g., a via having a cross sectional width of about 0.15 micron or under. Having recognized that the dominant electromigration failure mechanism in narrow lines is not along the interface between the inlaid Cu and capping layer, the present invention strategically avoids depositing a Cu alloy exhibiting higher resistivity than substantially pure Cu or other Cu alloys and formulated for reduced electromigration in the narrower trenches. The second Cu alloy formulated for improved electromigration resistance is strategically deposited to fill only the relatively wide trenches.

Embodiments of the present invention, therefore, comprise depositing a first layer comprising substantially pure Cu or a first Cu alloy having a minor amount of an alloying element or elements, such as Cu alloys containing minor amounts of elements that do not significantly increase the resistivity of the Cu alloy above about 2.0 μohm-cm, or a resistivity no more than about 20% greater than that of pure Cu. The initially deposited layer can also comprise Cu containing unavoidable impurities as well as alloying elements and/or ingredients present by virtue of the particular plating bath employed. It should be understood that the initially deposited layer is not a Cu alloy formulated for improved electromigration resistance which would otherwise increase the resistivity of the narrower lines to an unacceptable or undesirable extent.

Manifestly, the amount of metal present in the interconnection line is directly proportional to the width of the line. Wider lines require more of the second Cu alloy formulated to improve electromigration resistance by preventing diffusion along the larger interface surface. The present invention advantageously enables control of the amount of the second Cu alloy in different line widths to improve the weak inlaid metal-capping layer interface thereby improving electromigration resistance but without sacrificing resistivity or contact resistance in the narrower lines.

Accordingly, the initial layer of substantially pure Cu or the first Cu alloy is deposited to a sufficient extent to fill the narrower metal lines not subject to electromigration failure along the inlaid metal-capping layer interface since the interface is not significantly large. For example, it was found adequate to deposit the initial layer of substantially pure Cu or the first Cu alloy to completely fill the narrower trenches having a width of about 1 to about 5 times the smallest feature size, such as the smallest via, e.g., a via with a cross sectional width of about 0.15 micron or less. In so doing, a relatively thin metal overburden is formed over such narrower trenches, e.g., extending up to about 1,000 Å above the upper surface of the ILD. In accordance with embodiments of the present invention, a first annealing step is strategically conducted to allow Cu grain growth to relieve the stress accumulated during the initial damascene fill process. The anneal cycle temperature can range from about 100° C. to about 350° C. for about 2 minutes to about 1 hour. Annealing can be conducted in nitrogen, or in a forming gas containing about 1 to about 4 vol. % hydrogen, the balance nitrogen, or in a mixture of nitrogen, hydrogen and helium. The strategic implementation of an anneal at this point while there is a relatively small metal overburden overlying the filled narrower trenches substantially eliminates or significantly reduces the formation of voids in narrower lines.

Subsequently, the second Cu alloy formulated for improved electromigration resistance, e.g., an alloy containing a sufficient amount, such as about 0.5 at. % to about 5.0 at. %, of an element having a relatively low solid solubility in Cu, e.g., less than about 0.1 at. % in Cu at room temperature, such as tantalum, indium, tin, manganese, zinc, chromium and/or zirconium, is deposited to completely fill the larger openings and form an overburden on the substantially pure Cu or first Cu alloy overburden, having a thickness of about 1,000 Å to about 3,000 Å, thereby extending over the upper surface of the ILD to greater than about 2,000 Å. The second Cu alloy can have a resistivity not greater than about 2.0 μohm-cm or a resistivity no more than about 20% greater than that of pure Cu. Thus, the second Cu alloy is selectively deposited in the relatively wider trenches only, and the amount of the second Cu alloy progressively increases with increasing trench width, since wider trenches have more unfilled area after the initial metal deposition. As the narrower trenches are already filled and do not require a Cu alloy formulated for improved electromigration resistance along the interface between the inlaid metal and capping layer due to a small surface area, the absence of the second Cu alloy in the narrower trench openings preserves the low metal line resistance of the narrower lines.

Subsequently, CMP is conducted such that the upper surfaces of the field trenches or lines are substantially coplanar with the upper surface of the ILD. A second thermal annealing treatment is then conducted to allow Cu grain growth within the second Cu alloy and redistributing the alloy material into neighboring Cu grains. The second annealing can be conducted at a lower temperature than the first annealing, as about 100° C. to about 250° C., employing a similar ambient as during the first annealing. In employing a second Cu alloy containing tantalum, tantalum redistributes and segregates along the Cu surface to form an encapsulating layer. In employing a second Cu alloy containing indium and zirconium, the alloying elements form an intermetallic compound with Cu to encapsulate the upper surface.

A capping layer, such as silicon nitride, is then deposited to prevent Cu from diffusing into the next dielectric layer. Suitable capping materials also include silicon oxynitride or a low dielectric constant material, such as BLOK™ available from Applied Materials in Santa Clara, Calif. The second Cu alloy effectively prevents surface diffusion at the interface between the inlaid metal and capping layer thereby selectively improving electromigration resistance where needed.

In implementing embodiments of the present invention, metallization can be deposited by various techniques, such as electrodeposition or electroless plating. Typically, a conventional barrier layer and/or a seedlayer is initially deposited before filling the trenches. The initial deposition of substantially pure Cu or the first Cu alloy can be implemented by a conventional conformal- or a conventional preferential filling-type technique. Conformal filling can be implemented by electroplating, electroless plating and chemical vapor deposition techniques. Preferential filling can be implemented employing a conventional electroplating technique with bottom-enhanced filling chemistry and plating process controlled. For either conformal or preferential fill, bulk metal is deposited on the bottom as well as the sidewall of an opening and, therefore, relatively narrower lines are completely filled at a faster rate than relatively wider lines as metal from the sidewall of the narrower openings meet and coalesce more rapidly.

Bottom enhanced filling can be implemented employing a conventional additive designed to enhance bottom filling, such as Nanoplate 2001 or Ultrafill 2001, both manufactured by Shipley Co., of Marlboro, Mass., which additive can be mixed with the plating solution employed in the initial deposition process.

In implementing embodiments of the present invention, the dielectric layer can comprise any conventional dielectric material employed in the manufacture of semiconductor devices, including any of various of silicon oxides and low dielectric constant materials, including polymers. Suitable low dielectric constant materials include FLARE 2.0™ dielectric, a poly(arylene)ether available from Allied Signal Advanced Micro Electronic Materials, Sunnyvale, Calif., BCB (divinylsiloxane bis-benzocyclobutene) and SILK™, an organic polymer similar to BCB, both available from Dow Chemical Co., Middleton, Mich., silicon-carbon-oxygen-hydrogen (SiCOH) organic dielectrics, and BLACK DIAMOND™ dielectric available from Applied Material in Santa Clara, Calif.

An embodiment of the present invention is schematically illustrated in FIGS. 1A through 7 wherein similar features are denoted by similar reference numerals. Adverting to FIGS. 1A and 1B, a plurality of trenches $T_1$–$T_5$ having varying widths are formed in an ILD 10, e.g., a silicon oxide. A barrier layer 11 is then deposited, such as tantalum or tantalum nitride, lining each trench opening. A seedlayer (not shown) may also be employed. Typical seedlayers include Cu alloys containing magnesium, aluminum, zinc, zirconium, tin, nickel, palladium, silver or gold in a suitable amount, e.g, about 0.3 to about 12 at. %.

Figure 1B:
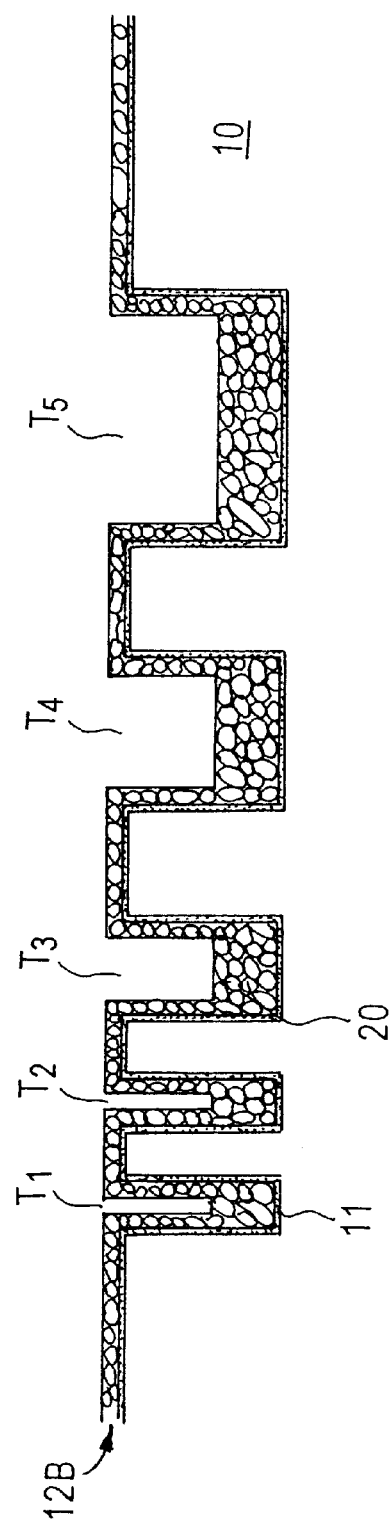

Substantially pure Cu or a first Cu alloy 20 having a resistivity of no greater than about 2.0 $\mu$ohm-cm is then deposited employing a conformal or preferential filling technique. In FIG. 1A, the initial Cu filling is illustrated with a conformal filling technique such as electroplating, electroless plating, physical vapor deposition or chemical vapor deposition. A preferential filling technique is illustrated in FIG. 1B and can be implemented using electroplating with bottom-enhanced filling chemistry and appropriate adjustment of the plating conditions. For either conformal or preferential filling, the initial layer of substantially pure Cu or first Cu alloy is deposited on the bottom of the trench as well as on the sidewalls thereby enabling the narrow lines to completely fill at a rate faster than the wider lines, since coalescence of the initial fill from the sidewalls occurs sooner.

Figure 2:
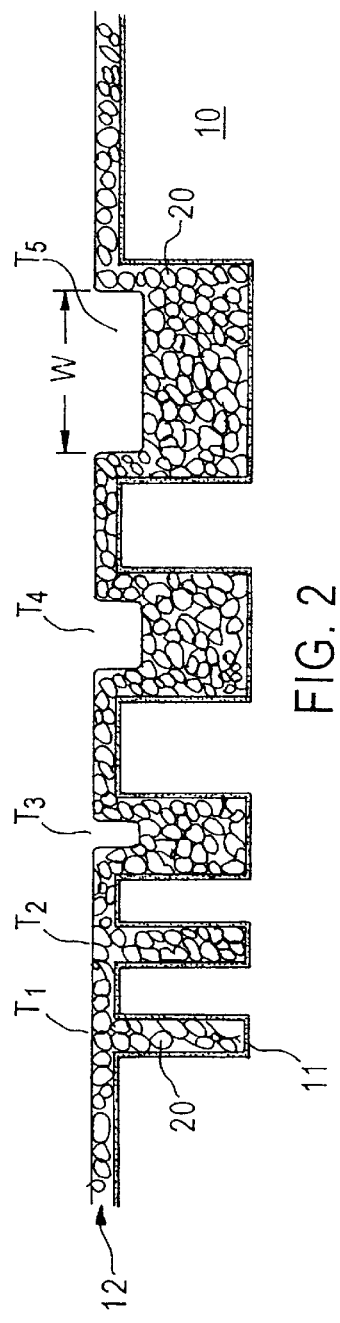

As shown in FIG. 2, continued initial deposition results in complete filling of the relatively narrower trenches $T_1$ and $T_2$ and incomplete filling of the relatively wider trenches $T_3$–$T_5$. The initial deposition is ceased upon filling of the narrower trenches, e.g., $T_1$ and $T_2$ with substantially pure Cu or the first Cu alloy 20 leaving a relatively small overburden 12, e.g., up to about 1,000 Å.

Figure 3:
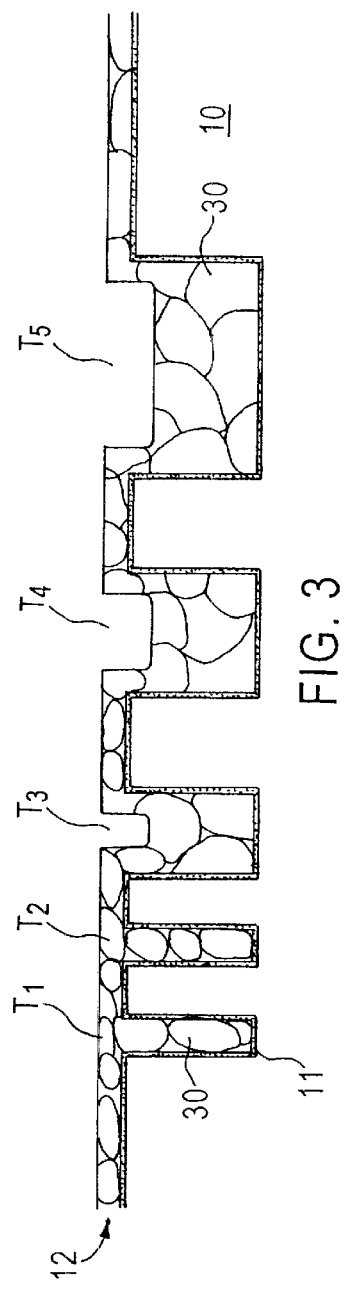
Figure 4:
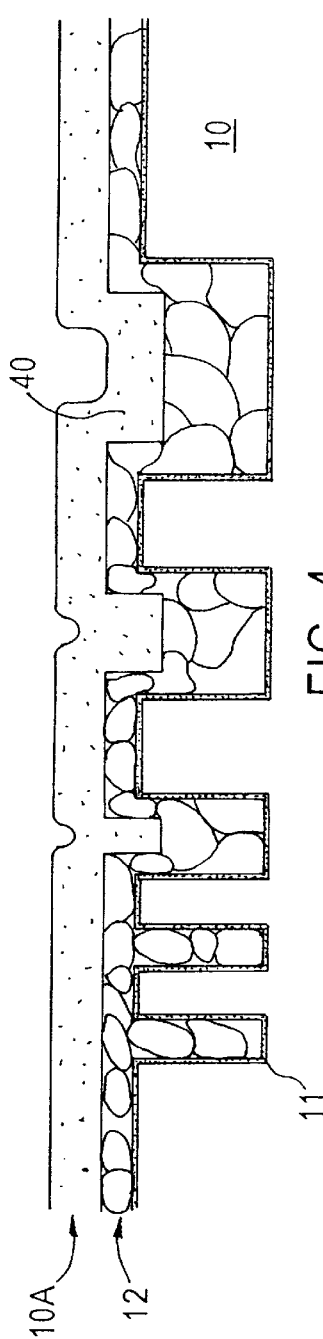

A first thermal annealing is then conducted, as at a temperature of about 100° C. to about 300° C., to effect grain growth and relief of the stress accumulated during damascene filling. The resulting structure having substantially pure Cu or the first Cu alloy with larger grains 30 is illustrated in FIG. 3. Subsequently, as shown in FIG. 4, the second Cu alloy 40 is selectively deposited into the relatively wider trenches $T_3$–$T_5$ completely filling them without entering the relatively narrower trenches $T_1$ and $T_2$ and forming an overburden 40A of about 1,000 Å to about 3,000 Å on the substantially pure Cu or Cu alloy overburden 12. The amount of the second Cu alloy 40 progressively increases with line width since the wider lines, e.g., trench $T_5$ having a width W, have larger unfilled openings after the initial metal deposition. By selectively depositing the second Cu alloy formulated for electromigration resistance only in the relatively wider trenches wherein electromigration resistance failure occurs, while avoiding depositing the second Cu alloy in the narrower trenches, electromigration resistance is improved without sacrificing narrow line resistance. In addition, voiding in narrower lines is substantially prevented or significantly reduced by conducting a first thermal anneal with a minimal overburden on the narrow lines.

Figure 5:
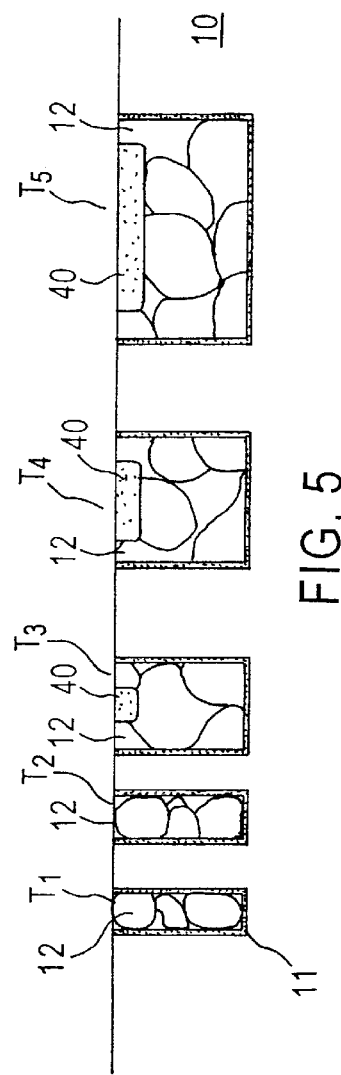

Subsequently, CMP is conducted, as shown in FIG. 5, to form a planarized upper surface. The relatively larger trenches ($T_3$–$T_5$), contain both the substantially pure Cu or the first Cu alloy 12 as well as the second Cu alloy 40.

Figure 6:
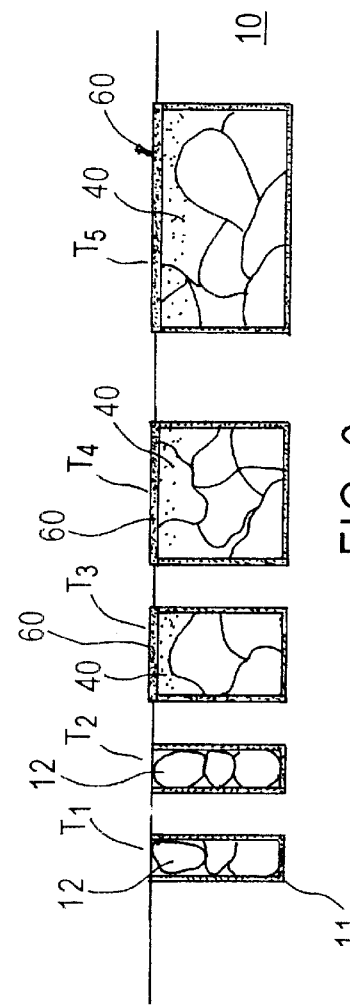
Figure 7:
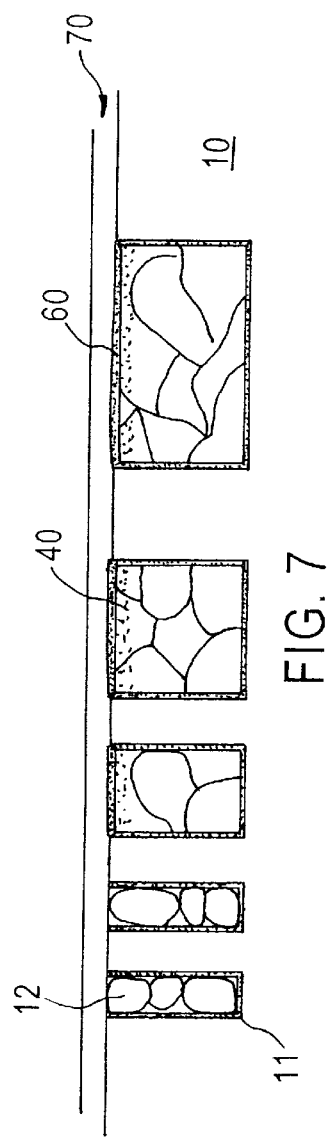

A second thermal annealing is then conducted, as a temperature of about 100° C. to about 250° C., to allow Cu grain growth within the second Cu alloy and redistribution of the alloying element to form an encapsulating layer 60 as shown in FIG. 6 that can comprise the alloying element or Cu-intermetallic compound. Subsequently, as shown in FIG. 7, a capping layer 70, such as silicon nitride, silicon oxynitride or a low-k material, is deposited.

Embodiments of the present invention enable fabrication of semiconductor devices with Cu metallization levels having varying line widths with an attendant reduction in electromigration failures at the interface between the inlaid metallization and capping layer, while preventing an undesirable increase in the resistance of the narrower lines. In addition, the strategic implementation of an annealing step after the narrower trenches are filled substantially prevents or significantly reduces voiding in the narrower metal lines.

The present invention enjoys industrial applicability in manufacturing highly integrated semiconductor devices containing Cu metallization interconnection patterns. The present invention enjoys particular applicability in manufacturing semiconductor devices exhibiting increased circuit speed and sub-micron dimensions, e.g., semiconductor devices having a design rule of about 0.12 micron and under.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A semiconductor device comprising:
   an interlayer dielectric (ILD);
   a plurality of trenches in the ILD, the plurality of trenches comprising:
      a plurality of small trenches having a width no greater than a first width; and
      a plurality of large trenches having width greater than the first width; and
   metal lines filling the trenches; wherein:
      the metal lines filling the small trenches comprise substantially pure copper (Cu) or a first Cu alloy; and
      the metal lines filling the large trenches comprise a lower layer of substantially pure Cu or the first Cu alloy and an upper layer of a second Cu alloy on the lower layer, the second Cu alloy containing an element in a sufficient amount such that the electromigration resistance of the second Cu alloy is greater than that of substantially pure Cu and greater than that of the first Cu alloy.

2. The semiconductor device according to claim 1, comprising vias including a via having a smallest via width, wherein the first width is about five times the smallest via width.

3. The semiconductor device according to claim 1, comprising substantially pure Cu filling the small trenches and forming the lower layer in the large trenches.

4. The semiconductor device according to claim 1, comprising an encapsulating layer on an upper surface of the second Cu alloy comprising an element of the second Cu alloy.

5. The semiconductor device according to claim 1, comprising a barrier layer lining the trenches with the substantially pure Cu or Cu alloy on the barrier layer.

6. The semiconductor device according to claim 1, wherein the small trenches filled with substantially pure Cu or the first Cu alloy have a width no greater than about 0.15 micron to about 7.5 microns.

* * * * *